United States Patent [19]
Rench et al.

[11] Patent Number: 5,449,294
[45] Date of Patent: Sep. 12, 1995

[54] MULTIPLE VALVE ASSEMBLY AND PROCESS

[75] Inventors: Michael E. Rench, Garland; Ted D. Schilling, Rowlett, both of Tex.

[73] Assignee: Texas Instruments Incorporated, Dallas, Tex.

[21] Appl. No.: 376,550

[22] Filed: Jan. 23, 1995

Related U.S. Application Data

[63] Continuation of Ser. No. 218,881, Mar. 25, 1994, abandoned, which is a continuation of Ser. No. 38,742, Mar. 26, 1993, abandoned.

[51] Int. Cl.⁶ ............................................. F16K 11/10
[52] U.S. Cl. ..................................... 437/225; 137/597
[58] Field of Search ...................... 137/597, 884, 240; 437/225; 118/715; 156/345

[56] References Cited

U.S. PATENT DOCUMENTS

| | | | |
|---|---|---|---|
| 4,383,547 | 5/1983 | Lorenz et al. | 137/240 |
| 4,554,942 | 11/1985 | Williams et al. | 137/240 |
| 4,711,268 | 12/1987 | Oleman | 137/597 |
| 4,714,091 | 12/1987 | Wagner | 137/884 |
| 4,917,136 | 4/1990 | Ohmi et al. | 137/240 X |
| 5,069,244 | 12/1991 | Miyazaki et al. | 137/240 X |
| 5,123,443 | 6/1992 | Garrison | 137/597 X |
| 5,137,047 | 8/1992 | George | 137/240 |

OTHER PUBLICATIONS

Aglo Manifolds catalog, Anderson, Greenwood & Co., Houston, Tex., USA. Oct. 1980.

*Primary Examiner*—John C. Fox
*Attorney, Agent, or Firm*—Warren L. Franz; W. James Brady; Richard L. Donaldson

[57] ABSTRACT

A multiple valve assembly incorporates three valves in one valve body. The main body has inlet and outlet ports in the mainline, and two sample ports, one on either side of the main valve seat. The valves and sample ports are oriented in only two planes for easy installation and access.

8 Claims, 2 Drawing Sheets

MULTIPLE VALVE ASSEMBLY AND PROCESS

This application is a continuation of application Ser. No. 08/218,881, filed Mar. 25, 1994, now abandoned; which is a continuation of application Ser. No. 08/038,742, filed Mar. 26, 1993, now abandoned.

FIELD OF THE INVENTION

This invention relates to semiconductor processes and apparatus, and more particularly to a multiple valve assembly and process for using the multi-valve assembly in combination with semiconductor process chambers and associated gas lines.

BACKGROUND OF THE INVENTION

Gas valves are commonly used in semiconductor processing systems as inlets and outlet for the introduction of gases in to processing chambers, and for providing the capability of purging and vacuum testing the process system. In some semiconductor processes, a plurality of process chambers or reactors may be sequentially connected to provide for a series of processing steps without removing the semiconductor devices from the series of process chambers. With prior art valves it is not possible to perform simultaneous purge and/or vacuum operation on the same line.

SUMMARY OF THE INVENTION

The invention provides a high purity metallic diaphragm valve which incorporates three valves into one valve body, and uses Ultra High Purity (UHP) construction and materials. Dead spaces are minimized. This valve assembly solves the problem of performing simultaneous purge and/or vacuum operations on the same line. By closing the middle or main line isolation valve, purging/vacuum operations may occur on the upstream portion of the line while the same is occurring downstream of the main valve seat, and visa versa. This allows preventative maintenance to occur downstream on the main isolation valve while recertification of operations occurs upstream.

The valve assembly incorporates three valves in one valve body. The main body has inlet and outlet ports in the mainline, and two sample ports, one on either side of the main valve seat. There is one valve associated with each sample port. The valves and sample ports are oriented in only two planes for easy installation and access.

The multiple valve assembly includes a principal channel extending between an inlet port and an outlet port, a first valve for closing the principal channel between said inlet port and said outlet port, a second channel intersecting said principal channel between said inlet port and said first valve, said second channel has a first port at an end of said channel opposite the end of said second channel that intersects said principal channel, a second valve for closing said second channel, a third channel intersecting said principal channel between said outlet port and said first valve, said third channel has a second port at an end of said channel opposite the end of said third channel that intersects said principal channel, and a third valve for closing said third channel.

The technical advance represented by the invention, as well as the objects thereof, will become apparent from the following description of a preferred embodiment of the invention, when considered in conjunction with the accompanying drawings and the novel features set forth in the appended claims.

DESCRIPTION OF A PREFERRED EMBODIMENT

Figure 1:
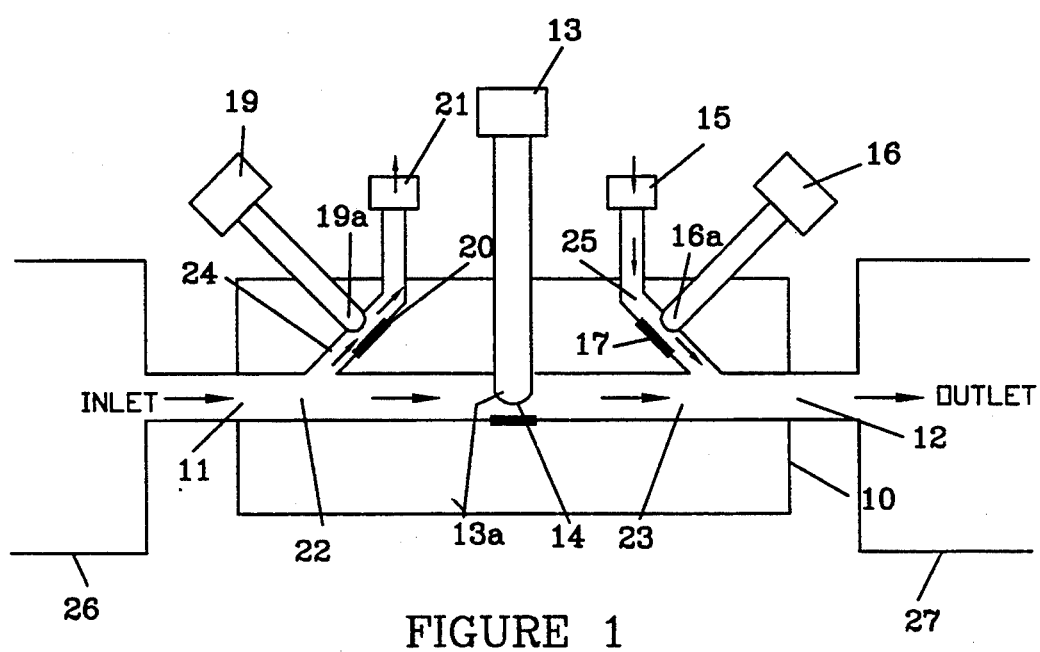
FIG. 1 shows the multiple valve assembly of the present invention.

FIG. 1 is a pictorial representation of the multiple valve assembly of the present invention which may be used to control the flow of process gases into and out of semiconductor process chambers and reactors. Valve assembly 10 has a principal inlet 11 and principal outlet 12 which are used to connect the valve, for example, between two semiconductor process chambers, or between a process chamber and other apparatus used in semiconductor processes. Valve assembly 10 has a main valve 13 located centrally to the valve assembly. Valve end 13a, in conjunction with valve seat 14, is used to open and close access between inlet 11 and flow channel 23, and outlet 12 and flow channel 22.

Connected to flow channel 22 is channel 24 which is connected to port 21. Valve 19 is located in channel 24 between channel 22 and port 21. Valve end 19a, in conjunction with valve seat 20, controls gas flow in channel 24.

Connected to flow channel 23 is channel 25 which is connected to port 15. Valve 16 is located in channel 25 between channel 23 and port 15. Valve end 16a, in conjunction with valve seat 17, controls gas flow in channel 25.

In an example of use, with valve 13 open and valves 16 and 19 closed, gas will flow through channels 22 and 23 to outlet 12. When valve 13 is closed, gas flowing in inlet 11 can be diverted through channel 24 to port 21 by opening valve 19. To supply gas to outlet 12, valve 16 may be opened and gas supplied through port 15.

In practice, if two process chambers 26, 27 are were connected to valve assembly 10, one chamber to the inlet 11 and another chamber to outlet 12, by closing valve 13, process chamber 26 connected to inlet 11 can be purged of used process gas by applying a vacuum to port 21. At the same time new process gas can be supplied to process chamber 27 connected to outlet 12. Therefore, the two process chambers 26, 27 can be purged of used process gases and supplied with fresh process gases independent of each other.

In normal operation, gas flows from inlet port 11 to outlet port 12. When valve 13 is closed, ports 15 and 21 are isolated. When valve 19 is opened, a vacuum pump can evacuate the system upstream of valve 13. A high purity inert purge gas can be connected to port 15 and, with valve 16 open, the purge gas is introduced into the system downstream of valve 13. This process may be reversed on ports 15 and 21. Any combination of vacuum/purge, purge/purge or vacuum/vacuum may be initiated on ports 15 and 21 with valve 13 closed.

Figure 2:
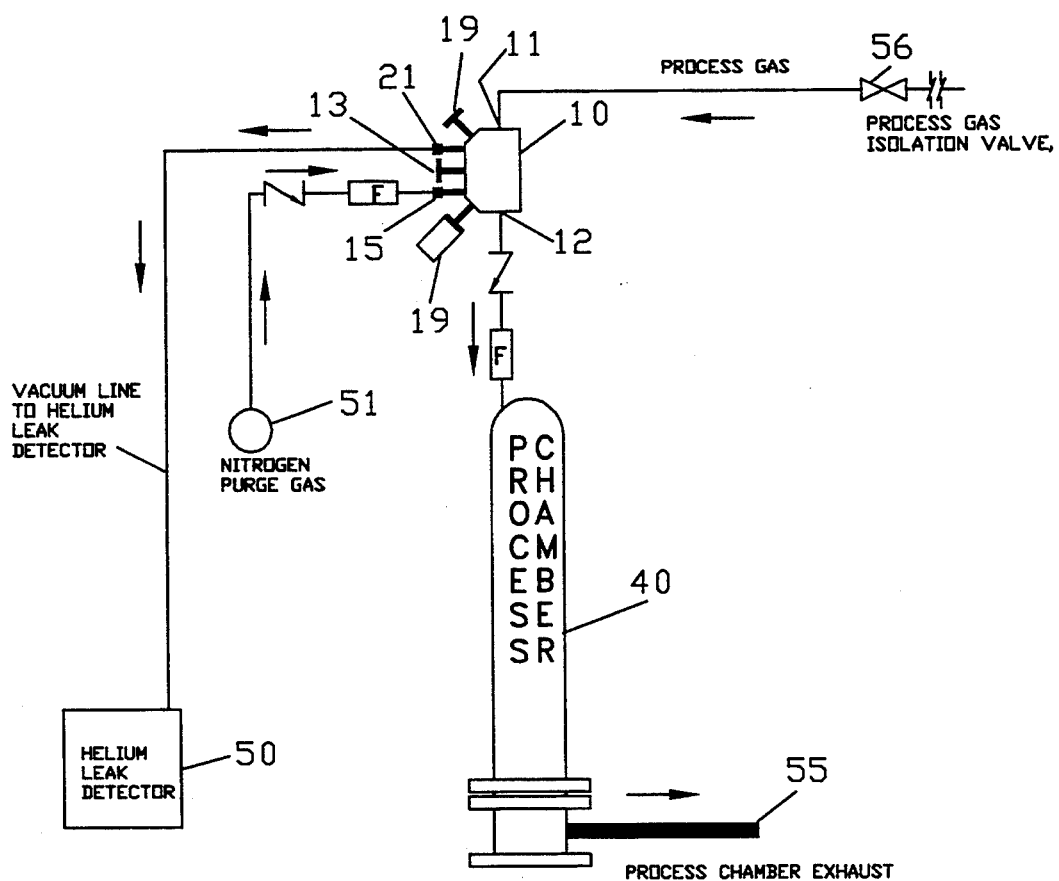
FIG. 2 illustrates an application of the three valve assembly.

FIG. 2 illustrates the multiple valve assembly 10 when used in conjunction with a process gas line under vacuum for helium leak testing. The following test procedure and set-up is used after initial installation or exposure of the line to the atmosphere.

Closing valve 13 isolates valve 19 from valve 16. The helium leak detector 50 pulls a vacuum from process gas isolation valve 56 through ports 11 and 21. Helium is sprayed on all welded and mechanical joints in the system and pulled through helium leak detector 50. The helium leak detector alarms audibly if a leak exists.

During this operation, a nitrogen purge must be maintained on the process chamber 40 to minimize atmospheric contamination from entering the chamber. The purge gas is introduced into process chamber 40 from a purge gas source 51 through valve 15 and port 15. The purge gas flowing into process chamber 40 is exhausted through port 55 of process chamber 40.

This same concept may he utilized on any system in which gas lines upstream and downstream of main valve 13 require independent operations performed at the same time. Particle and residual gas analysis and/or purges for contamination minimization may be performed simultaneously, reducing equipment downtime and system certification time.

What is claimed:

1. A method for purging and vacuum testing a semiconductor process system, said system including a semiconductor processing chamber and a source of process gas, and said method comprising:

providing a unitary tri-valve assembly, comprising a principal channel extending between an inlet port and an outlet port; a first valve for closing the principal channel between said inlet port and said outlet port; a second channel intersecting said principal channel between said inlet port and said first valve; a second valve for closing said second channel; a third channel intersecting said principal channel between said outlet port and said first valve; and a third valve for closing said third channel;

)nnecting said tri-valve assembly between said processing chamber and said source of process gas, with said source of process gas connected to said inlet port and said outlet port connected to said processing chamber;

closing said first valve to isolate said outlet port from said inlet port;

with said first valve closed, connecting a vacuum pump to said second channel and opening said second valve to evacuate elements of said system upstream of said valve assembly inlet port; and with said first valve closed, connecting a source of purge gas to said third channel and opening said third valve to flow said purge gas to purge elements of said system downstream of said valve assembly outlet port.

2. A method as defined in claim 1, wherein said vacuum pump is a helium leak detector; and said method further comprises a step of spraying helium on joints of said system upstream of said valve assembly input port, and detecting for leaks using said leak detector.

3. A method as defined in claim 1, wherein said source of purge gas is a source of nitrogen purge gas; said process chamber has an exhaust port; and said purge gas is flowed to said processing chamber and exhausted through said exhaust port.

4. A method as defined in claim 1, wherein said source of purge gas is a source of nitrogen purge gas; said process chamber has an exhaust port; said purge gas is flowed to said processing chamber and exhausted through said exhaust port; said vacuum pump is a helium leak detector; and said method further comprises a step of spraying helium on joints of the system upstream of said valve assembly input port, and detecting for leaks using said leak detector.

5. A method for purging used process gas and supplying fresh process gas to connected process chambers in a semiconductor process system; said method comprising:

providing a unitary tri-valve assembly, comprising: a principal channel extending between an inlet port and an outlet port; a first valve for closing the principal channel between said inlet port and said outlet port; a second channel intersecting said principal channel between said inlet port and said first valve, said second channel has a first port at an end of said channel opposite the end of said second channel that intersects said principal channel; a second valve for closing said second channel; a third channel intersecting said principal channel between said outlet port and said first valve, said third channel has a second port at an end of said channel opposite the end of said third channel that intersects said principal channel; and a third valve for closing said third channel;

connecting said tri-valve assembly between first and second processing chambers, with said first processing chamber connected to said inlet port and said second processing chamber connected to said outlet port;

closing said first valve to isolate said outlet port from said inlet port;

with said first valve closed, opening said second valve and purging used process gas from said first one of said process chambers through said first port, second channel and inlet port; and with said first valve closed, opening said third valve and supplying new process gas to said other of said process chambers through said second port, third channel and outlet port.

6. A method as defined in claim 5, further comprising the step of:

with said first valve dosed and after purging said used process gas from said first process chamber, opening said second valve and supplying new process gas to said first process chamber through said first port, second channel and inlet port.

7. A method as defined in claim 5, further comprising the step of:

with said first valve closed and before supplying new process gas to said second process chamber, opening said third valve and purging used process gas from said second chamber through said second port, third channel and outlet port.

8. A method as defined in claim 5, further comprising the steps of:

with said first valve closed and after purging said used process gas from said first process chamber, opening said second valve and supplying new process gas to said first process chamber through said first port, second channel and inlet port; and with said first valve closed and before supplying new process gas to said second process chamber, opening said third valve and purging used process gas from said second chamber through said second port, third channel and outlet port.

* * * * *